United States Patent
Roberts

(10) Patent No.: US 7,934,187 B1
(45) Date of Patent: Apr. 26, 2011

(54) METHOD AND APPARATUS FOR PERFORMING ELECTRICAL RULE CHECKS ON A CIRCUIT DESIGN

(75) Inventor: Mark B. Roberts, Auburn, CA (US)

(73) Assignee: Xilinx, Inc., San Jose, CA (US)

( * ) Notice: Subject to any disclaimer, the term of this patent is extended or adjusted under 35 U.S.C. 154(b) by 334 days.

(21) Appl. No.: 11/477,700

(22) Filed: Jun. 29, 2006

(51) Int. Cl.
*G06F 9/455* (2006.01)

(52) U.S. Cl. ........ 716/111; 716/106; 716/107; 716/110; 716/112; 716/126; 703/13; 703/19

(58) Field of Classification Search ............. 716/12–14, 716/4–6, 106, 107, 110, 111, 112, 126, 136; 703/13, 19
See application file for complete search history.

(56) References Cited

U.S. PATENT DOCUMENTS

| | | | | |
|---|---|---|---|---|
| 6,055,366 A * | 4/2000 | Le et al. | ............................ | 716/1 |
| 6,209,123 B1 * | 3/2001 | Maziasz et al. | ................. | 716/14 |
| 6,470,489 B1 * | 10/2002 | Chang et al. | ..................... | 716/21 |
| 6,836,877 B1 * | 12/2004 | Dupenloup | ...................... | 716/18 |
| 7,031,889 B1 * | 4/2006 | McBride | ........................... | 703/2 |
| 2003/0208721 A1 * | 11/2003 | Regnier | ............................ | 716/1 |
| 2005/0050484 A1 * | 3/2005 | Keller et al. | ..................... | 716/4 |
| 2005/0050492 A1 * | 3/2005 | Keller et al. | ..................... | 716/5 |
| 2005/0050506 A1 * | 3/2005 | Keller et al. | ..................... | 716/12 |
| 2005/0160386 A1 * | 7/2005 | Mortensen et al. | ............... | 716/4 |
| 2005/0188336 A1 * | 8/2005 | Mortensen et al. | ............... | 716/5 |

* cited by examiner

*Primary Examiner* — Paul Dinh
*Assistant Examiner* — Nha T Nguyen
(74) *Attorney, Agent, or Firm* — Robert M. Brush; Thomas George

(57) ABSTRACT

Method, apparatus, and computer readable medium for performing electrical rule checks (ERCs) on a circuit design are described. In one example, a hierarchy of cell instances is created from a schematic database for the circuit design. The hierarchy is traversed to produce master nets. Each of the master nets is associated with shorted nets in the circuit design. The hierarchy is traversed to produce ERC nets. Each of the ERC nets is associated with effectively shorted nets in the circuit design. At least one pair of the effectively shorted nets is effectively shorted across a transistor. At least one ERC is performed on the circuit design using the master nets and the ERC nets.

14 Claims, 5 Drawing Sheets

300

METHOD AND APPARATUS FOR PERFORMING ELECTRICAL RULE CHECKS ON A CIRCUIT DESIGN

FIELD OF THE INVENTION

One or more aspects of the present invention relate generally to electronic design and modeling systems for electronic circuits and, more particularly, to a method and apparatus for performing electrical rule checks on a circuit design.

BACKGROUND OF THE INVENTION

The design process for integrated circuits contains a number of well known sequential operations. Initially, the proposed functionality of a circuit is analyzed by one or more chip designers. These designers then use design capture tools to describe the logical components of the circuit and their interactions. After circuits for an integrated circuit have been designed, such designs are converted to a physical representation known as a "circuit layout" or "layout." Conventionally, a layout may be viewed as an elevational view representing semiconductor process layers forming physical devices, such as transistors, contacts, and buses, among other well-known circuit elements.

During the design process, a circuit design must be checked to ensure compliance with various electrical rule guidelines. The process of checking a circuit design for compliance with an electrical rule guideline is referred to as an electrical rule check (ERC). A given ERC may check for electrical errors, such as two output pins being connected together, and for design input errors, such as duplicate designators. Conventionally, ERC checks are made by hand or at the layout level, which relies on a correctly labeled layout. This results in a time consuming and error prone methodology. In addition, the discovery of an ERC violation at the layout level may require re-design and subsequent re-layout, which is costly in both time and resources. Accordingly, there exists a need in the art for a more efficient method and apparatus for performing electrical rule checks on a circuit design.

SUMMARY OF THE INVENTION

Method, apparatus, and computer readable medium for performing electrical rule checks (ERCs) on a circuit design are described. In one embodiment, a hierarchy of cell instances is created from a schematic database for the circuit design. The hierarchy is traversed to produce master nets. Each of the master nets is associated with shorted nets in the circuit design. The hierarchy is traversed to produce ERC nets. Each of the ERC nets is associated with effectively shorted nets in the circuit design. At least one pair of the effectively shorted nets is effectively shorted across a transistor. At least one ERC is performed on the circuit design using the master nets and the ERC nets.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
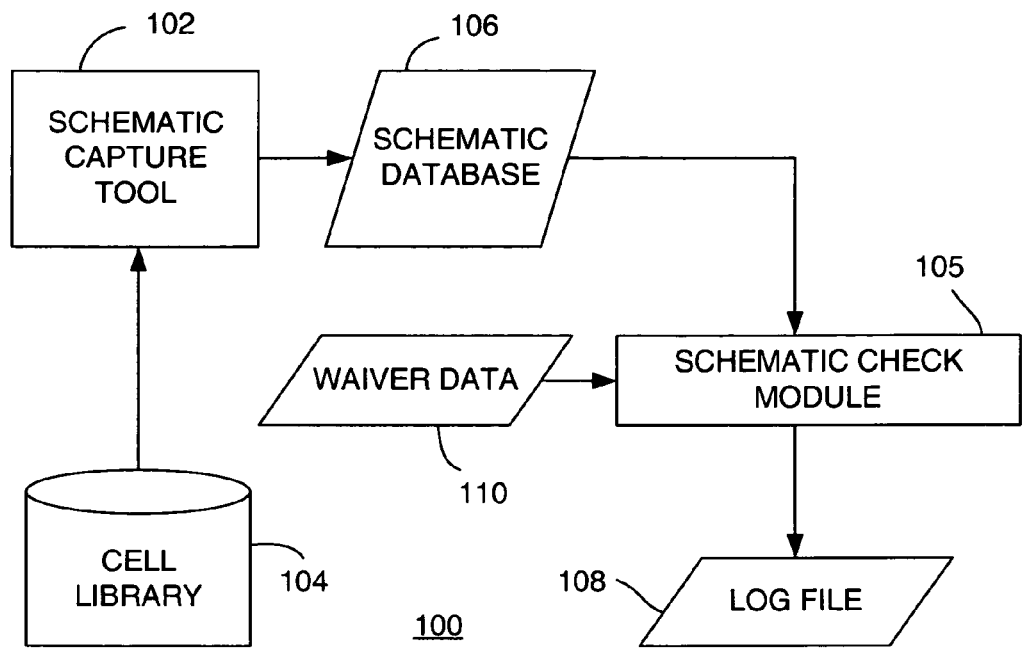
FIG. 1 is a block diagram depicting an exemplary embodiment of a system for performing electrical rule checks (ERCs) on a circuit design in accordance with one or more aspects of the invention.

FIG. 1 is a block diagram depicting an exemplary embodiment of a system 100 for performing electrical rule checks (ERCs) on a circuit design in accordance with one or more aspects of the invention. The system 100 includes a schematic capture tool 102, a cell library 104, and a schematic check module 105. The system 100 may be implemented using the computer 600 of FIG. 6 and described below. Notably, the elements of the system 100 may be part of one or more software programs stored in a memory and configured for execution by a central processing unit (CPU).

The schematic capture tool 102 is configured to capture a circuit design from a user and generate a schematic database 106. The schematic capture tool 102 may include a graphic interface through which a designer connects symbols and blocks representing various circuit elements to produce a schematic description of the circuit design. The schematic database 106 includes instances of cells forming a top-level schematic to logically represent the circuit design. Each cell is a schematic of a particular circuit component. A cell may represent components from low-level to high-level, such as a wire, transistor, logic gate, multiplexer, memory, video decoder, or the like. Standard cells may be stored in the cell library 104 coupled to the schematic capture tool 102 (e.g., transistors, logic gates, etc.). Each cell includes one or more ports that define the input/output interface of the cell.

A cell may also include instances of other cells. For example, a logic gate cell includes instances of transistor cells. In general, when a cell is placed in a schematic, it becomes an instance. An instance of a cell includes one or more pins that define the input/output interface of the instance. Pins are instances of ports on an instantiated cell. A cell also includes various connections referred to as nets. A net may electrically couple a plurality of pins in a cell, or at least one pin and a port in the cell. The top-level schematic in the schematic database 106 is actually a cell having one or more ports and instances of other cells.

Figure 3:
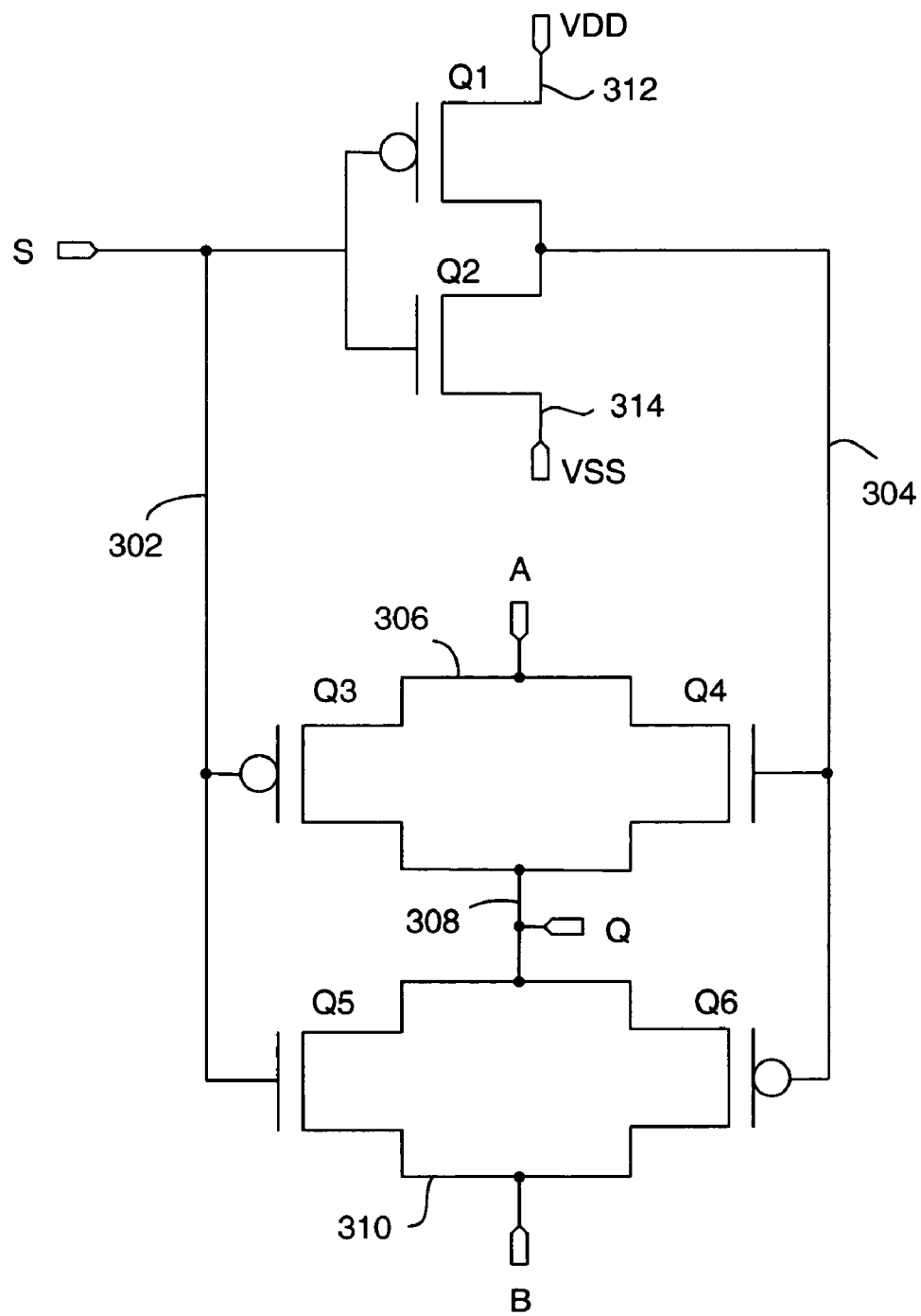
FIG. 3 is an illustrative schematic depicting a 2:1 multiplexer.
Figure 4:
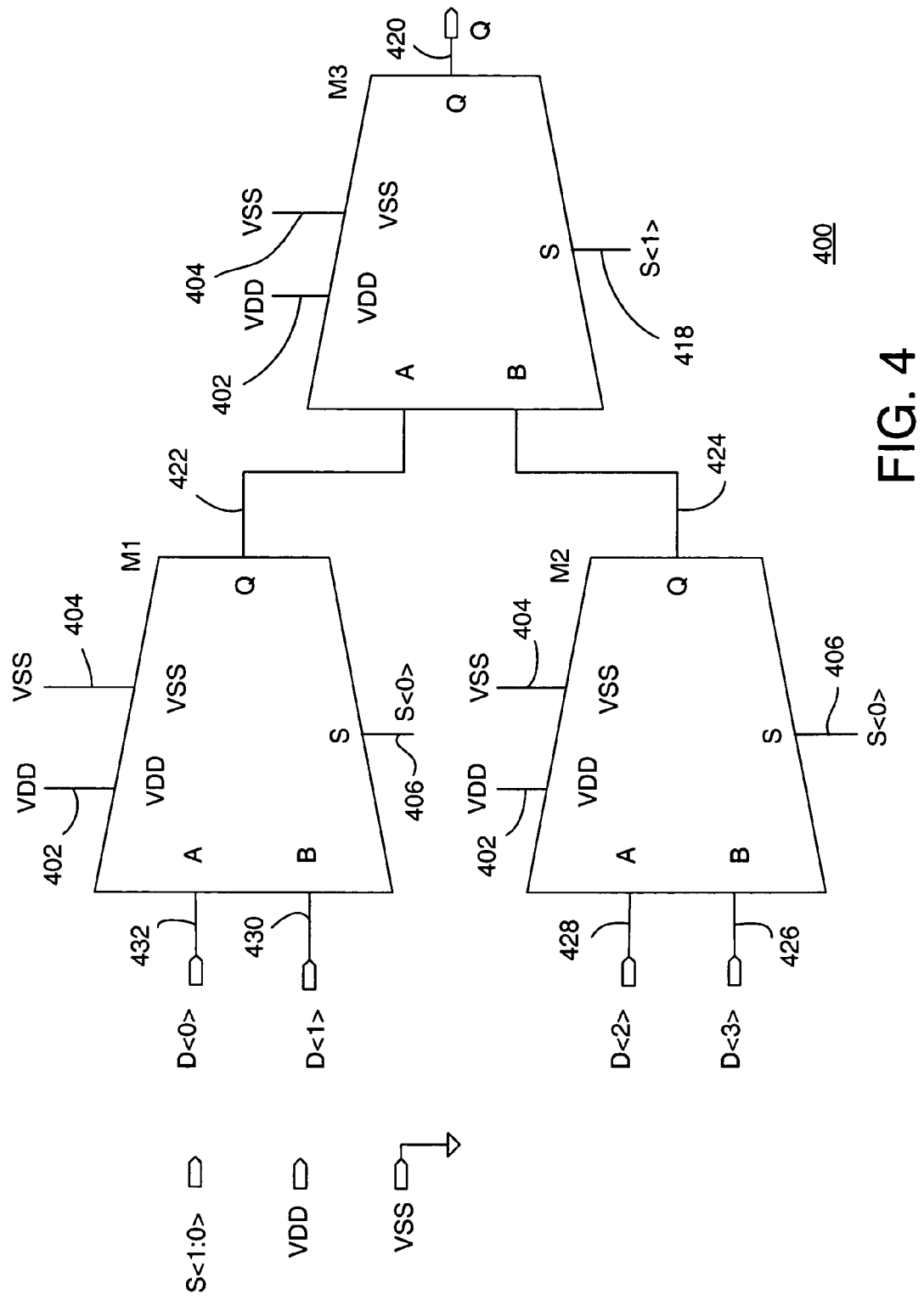
FIG. 4 is an illustrative schematic depicting a 4:1 multiplexer.

Exemplary schematics are shown in FIGS. 3 and 4. FIG. 3 is an illustrative schematic 300 depicting a 2:1 multiplexer. The schematic 300 represents a cell having six ports designated as S, VDD, VSS, Q, A, and B, six transistors designated as Q1 through Q6, and nets 302 through 314. Each of the transistors Q1 through Q6 is an instance of a metal-oxide semiconductor field-effect transistor (MOSFET) cell. The transistors Q1, Q3, and Q6 are instances of p-channel MOSFETS (PMOS) cells, and the transistors Q2, Q4, and Q5 are instances of n-channel MOSFETS (NMOS) cells. Each of the transistors Q1 through Q6 includes pins (i.e., port instances) for a source, drain, and gate. Each of the nets 302 through 314 is defined as a connection between a plurality of pins or at least one pin and a port. For example, the net 302 couples the gate pins of the transistors Q1, Q2, Q3, and Q5 and the port S. The net 304 couples the drain pins of the transistor Q1 and Q2 and the gate pins of the transistors Q4 and Q6. The net 312 couples the source pin of the transistor Q1 with the port VDD. The net 314 couples the source pin of the transistor Q2 with the port VSS. The net 306 couples the source pins of the transistors Q3 and Q4 and the port A. The net 308 couples the drain pins of the transistors Q3, Q4, Q5, and Q6 and the port Q. The net 310 couples the source pins of the transistors Q5 and Q6 with the port B.

FIG. 4 is an illustrative schematic 400 depicting a 4:1 multiplexer. The schematic 400 represents a cell having five ports designated as VDD, VSS, S (2 bits wide), D (four bits wide), and Q, three 2:1 multiplexers M1 through M3, and nets 402 through 432. Each of the multiplexers M1 through M3 is an instance of the cell represented by the schematic 300 of FIG. 3. For each of the multiplexers M1 through M3, the S, VDD, VSS, Q, A, and B ports are pins in the schematic 400. Again, each of the nets 402 through 432 is defined as a connection between a plurality of pins or at least one pin and a port. For example, the net 422 couples the Q pin of the multiplexer instance M1 with the A pin of the multiplexer instance M3. The net 420 couples the Q pin of the multiplexer M3 with the Q port of the cell represented by the schematic 400. FIGS. 3 and 4 are shown for the purpose of illustrating cells, instances, ports, pins, and nets, as well as for illustrating aspects of the process described below. Thus, the schematics 300 and 400 are merely illustrative and the processes described below may be employed on any type of schematic data. Operation of the circuits shown in the schematics 300 and 400 is well known in the art.

Returning to FIG. 1, the schematic check module 105 is configured to process the schematic data in the schematic database 106 and perform one or more electrical rule checks (ERCs). Exemplary ERC checks for a complementary metal-oxide semiconductor (CMOS) device include: floating gate or bulk pins, voltage dependent transistor sizing, voltage restrictions on gate, source, drain, and bulk pins, and the like. The schematic check module 105 produces a log file 108 as output, which includes data indicative of any ERC violations. The schematic check module 105 may also receive waiver data 110. The waiver data 110 includes information for waiving any known ERC violation. The schematic check module 105 will exclude any waived ERC violations from the log file 108. The schematic check module 105 performs ERC checking directly from the schematic data in the schematic database (i.e., pre-layout). This provides for early detection of ERC violations in the overall design process. Operation of the schematic check module 105 is described immediately below. In another embodiment, the schematic check module 105 may be configured to process a netlist, rather than the schematic database 106. As is well known in the art, a netlist and the schematic database are different mechanisms for representing the same data. Thus, as used herein, the term "schematic database" is meant to include netlist representations of the circuit design.

Figure 2:
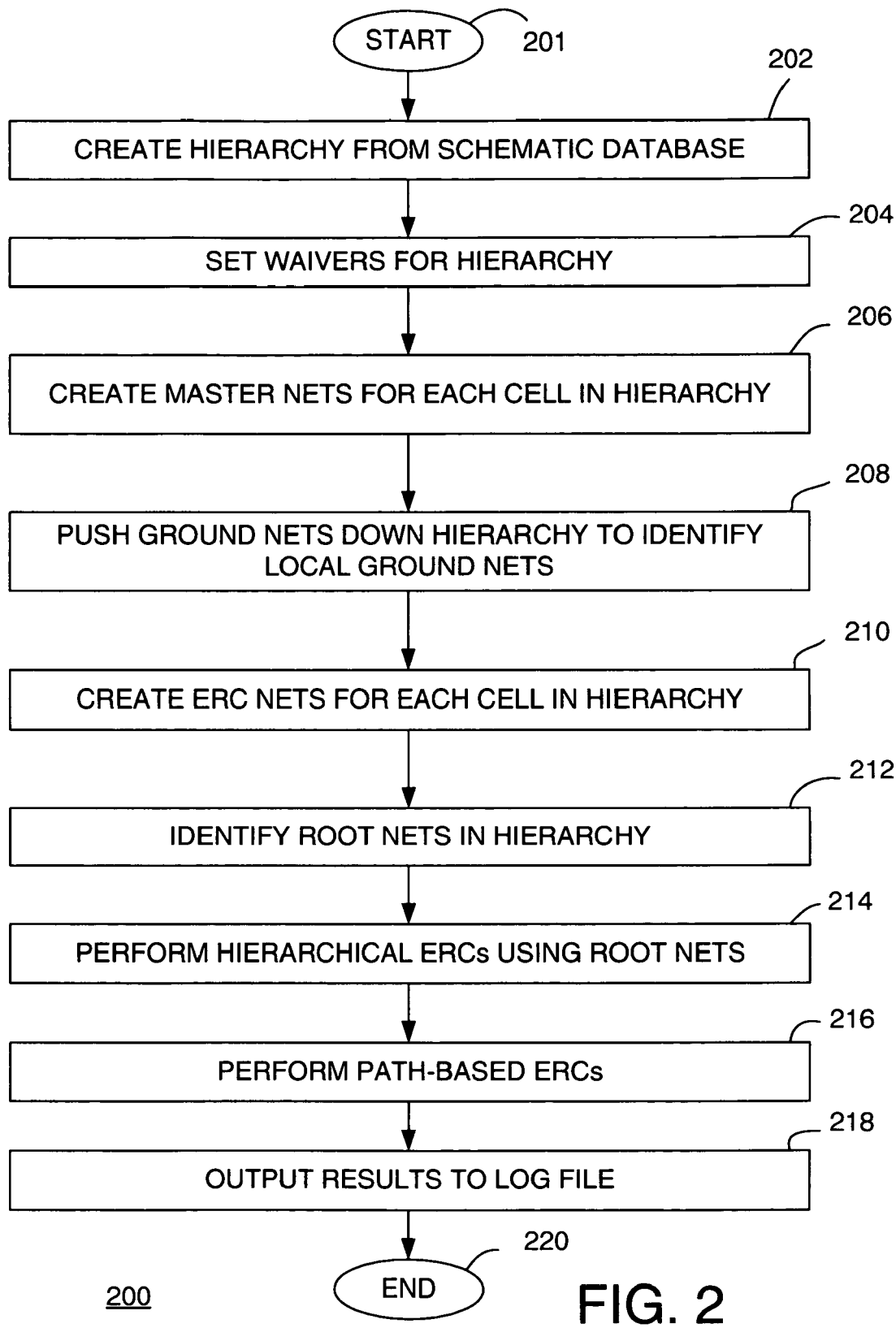
FIG. 2 is a flow diagram depicting an exemplary embodiment of a method for performing ERC checks on a circuit design in accordance with one or more aspects of the invention.

FIG. 2 is a flow diagram depicting an exemplary embodiment of a method 200 for performing ERC checks on a circuit design in accordance with one or more aspects of the invention. The method 200 begins at step 201. At step 202, a hierarchy of cell instances is created from a schematic database for a circuit design. In one embodiment, the hierarchy comprises a hierarchical directed graph. As used herein, cell instances are referred to simply as "instances" and the hierarchy of cell instances is referred to as the "hierarchy."

Figure 5:
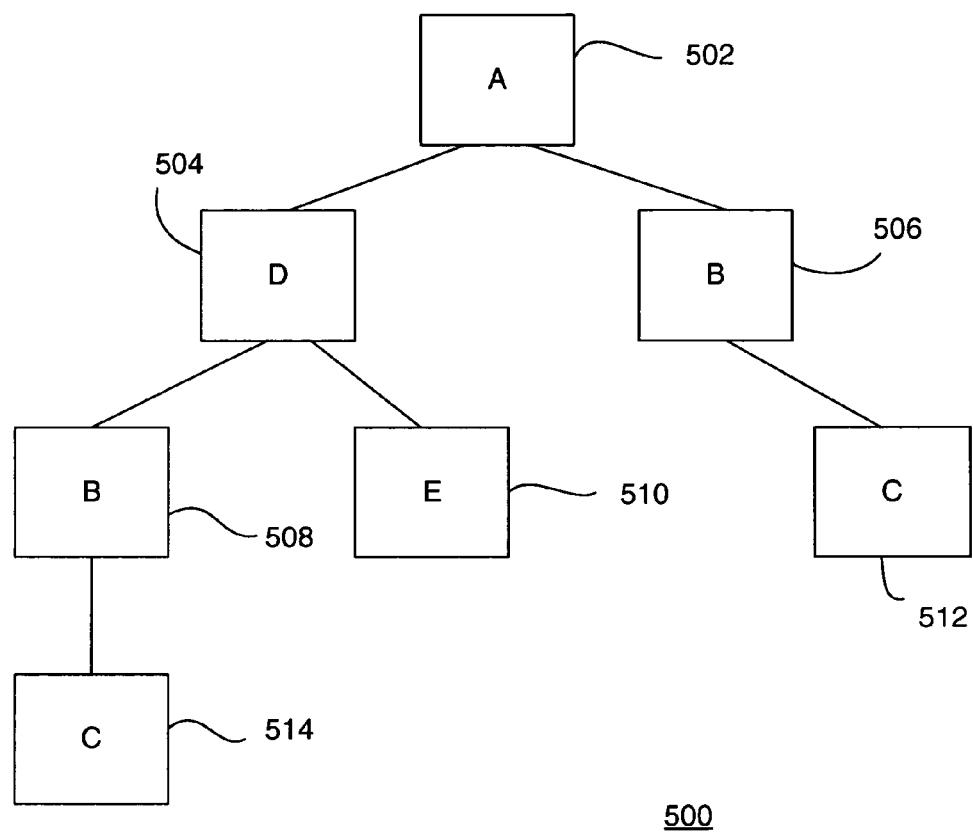
FIG. 5 is a block diagram depicting an exemplary hierarchy of cell instances.

FIG. 5 is a block diagram depicting an exemplary hierarchy 500 formed at step 202. The hierarchy 500 includes instances 502 through 514 of cells A through E. The instance 502 of cell A is the top-level of the hierarchy 500. The instances 504 and 506 are instances of cells D and B, respectively, in the instance 502 of cell A. The instance 512 is an instance of cell C in the instance 506 of cell B. The instances 508 and 510 are instances of cells B and E, respectively, in the instance 504 of cell D. The instance 514 is an instance of cell C in the instance 508 of cell B. The instances 510, 512, and 514 do not include any cell instances and are thus leaf instances of the hierarchy 500. Notably, the hierarchy 500 includes two instances of the B cell (506 and 508). The hierarchy 500 includes a small number of instances and cells for purposes of clarity by example (e.g., 7 instances and 5 cells). In practice, the hierarchy formed at step 202 includes any number of instances depending on design complexity.

Returning to FIG. 2, each of the nets in the hierarchy is assigned one or more attributes. The attributes for a net relate to the ports/devices to which the net is connected. Exemplary attributes for a net include whether the net is connected to a thin oxide (thinox), mid-oxide (midox), or thick oxide (thickox) device, whether the net is connected to a signal port, a ground port, a supply port, and the like. In some embodiments, attributes for a net may include what type of supply the net is connected (e.g., there may be different supply voltages in the circuit design).

At step 204, waivers are set for the hierarchy, e.g., 500. The waivers provide a mechanism for waiving known ERC violations in the circuit design. At step 206, the hierarchy, e.g., 500, is traversed to produce master nets. In one embodiment, one or more master nets are defined for each cell in the hierarchy. Each of the master nets is associated with shorted nets in the circuit design and includes the combined attributes of the shorted nets. In each cell, nets that are shorted together by an instance of a "wire" cell or by the shorted pins/ports of an instance of a hierarchical cell referencing the same master net.

Notably, it is a limitation of many schematic capture systems that only one port can be connected to a net (i.e., ports cannot be shorted together in a cell definition). In actual practice, however, it is sometimes necessary to provide the capability to short ports together. This is done by inserting an instance that shorts two nets together between the two ports. In simulators, this is often done with a low value resistor. Alternatively, a leaf cell referred to above as a wire cell can be used to implement the net shorting capability. In any case, the port shorting limitation is resolved by master nets (which short across instances of wire cells), and by keeping track of shorted ports on a hierarchical basis. Thus, even though master nets also only have one possible port connection, the ports can be shorted together by the master net at the next level up.

The traversal of the hierarchy begins at the bottom such that master nets are first defined for the unique cells in the lower level instances. Notably, once the master net(s) are defined for a cell, the remaining instances of that cell, if any, do not have to be processed (traversed). For example, in FIG. 5, once the instance 508 is processed to define the master net(s) for the cell B, it is not necessary to process the instance 506 of the cell B. From the lower level instances, the hierarchy is traversed upwards until master nets(s) are defined for each of the cells in the hierarchy.

At step 208, ground nets in the circuit design are pushed down the hierarchy to identify local grounds. Notably, in some cells, ground nets are not explicitly defined. For example, the schematic 300 in FIG. 3 does not include an explicit ground net. However, when such a cell is instantiated, one or more of its instantiated ports may be coupled to a ground net. At step 208, such a ground net is "pushed down" to the cell by associating the port with ground. For example, in the schematic 400 of FIG. 4, the Vss port is grounded. Thus, the Vss pin on each of the multiplexers M1 through M3 is grounded. This ground reference is pushed down to the schematic 300, where the Vss port is associated with ground. Thus, the attributes of any net coupled to the Vss port in the schematic 300 are modified to incorporate the ground reference.

At step 210, the hierarchy is traversed to produce ERC nets. Each of the ERC nets is associated with effectively shorted nets in the circuit design. Nets are "effectively shorted" for purposes of step 210 if they are connected (actually shorted) or if one net is coupled to the source of a transistor and the other net is coupled to the drain of the transistor. Such nets are considered to be effectively shorted across the transistor. An ERC net includes the combined attributes of its nets. For example, in FIG. 3, the nets 306, 308, and 310 comprise an ERC net for the cell (i.e., each of the nets 306, 308, and 310 are associated with the same ERC net). ERC nets do not include any ground nets. Thus, the nets 312 and 304 are part of the same ERC net, but the net 314 is not part of that ERC net. As described above, in the example of FIGS. 3 and 4, the Vss port to which the net 314 is connected is actually coupled to ground. The net 314 will include a ground reference after execution of the step 208. ERC nets provide an efficient means to make voltage dependent ERC checks, as discussed below.

Similar to the master nets, once the ERC net(s) are defined for a cell, the remaining instances of that cell, if any, do not have to be processed (traversed). For example, in FIG. 5, once the instance 508 is processed to define the ERC net(s) for the cell B, it is not necessary to process the instance 506 of the cell B.

At step 212, root nets in the hierarchy are identified. A root net is a master net or an ERC net having only pin connections (connections to instances) and no port connections (connections out of an instance to a new level of the hierarchy). The only exception is a master net or ERC net in the top level of the hierarchy, where all nets are considered root nets. Note that root nets are a pseudo-hierarchical construct, since they may span more than one level of the hierarchy, but they are not duplicated for each instance of a cell. There are separate root nets for master nets and ERC nets. A root net holds the combined attributes of each lower level master or ERC net.

For example, assume the schematic 400 is the top level cell. Then, one root net in that cell is defined by the net 428 and the master net in the schematic 300 defined by the net 304. Although this root net is coupled to a port (port D<2>), the schematic 400 is the top level cell. In the schematic 300, the master net defined by net 304 is a root net, since it includes only pin connections (i.e., the gate of transistor Q6, the gate of transistor Q4, and the drains of transistors Q1 and Q2, which are all pins). Another root net in the schematic 400 is defined by the nets 420 through 432, and the ERC net in the schematic 300 defined by the nets 306, 308, and 310. Note that the ERC net in the schematic 300 defined by the nets 306, 308, and 310 effectively short ports A, B, and Q for ERC purposes. Thus, the A, B, and Q pins of the multiplexers M1, M2, and M3 are shorted. The identified root nets are used to perform one or more ERC checks on the circuit design, as described below.

At step 214, one or more hierarchical ERCs are performed using the root nets. For some hierarchical ERC checks, the information attached to a root net (i.e., the combined attributes of the lower master or ERC nets) is all that is needed. ERC root nets provide an efficient mechanism for performing voltage dependent ERC checks. For example, the voltage rails of any net can be determined by examining the properties of an associated ERC root net. In another example, thinox devices are not allowed at high voltage levels. Both the voltage level and connection to thinox devices are attributes of an ERC net. Thus, a check for this rule can be made by checking the attributes of each root ERC net in the hierarchy. If a violation is found, then the root net is traced to find all occurrences of thinox devices on the net. In this manner, an ERC is executed efficiently. Other types of voltage dependent ERC checks include voltage restrictions on nets driving transistors, such as PMOS tub voltages that are less than their associated source voltages, and the like.

Master nets provide an efficient mechanism for performing other types of hierarchical net checks. Exemplary checks include output pins driven by a supply, or source and drain connections between two different power supplies or a power supply and ground.

At step 216, one or more path based ERC checks may be performed. For example, some ERC checks depend on the particular path of instances in the hierarchy. Such ERC checks include, for example, voltage dependent size checks and the like. At step 218, the results of the ERC checks performed at steps 214 and/or 216 are outputted in a log file. Violations that are waived according the waivers obtained at step 204 are omitted from the log file.

Figure 6:
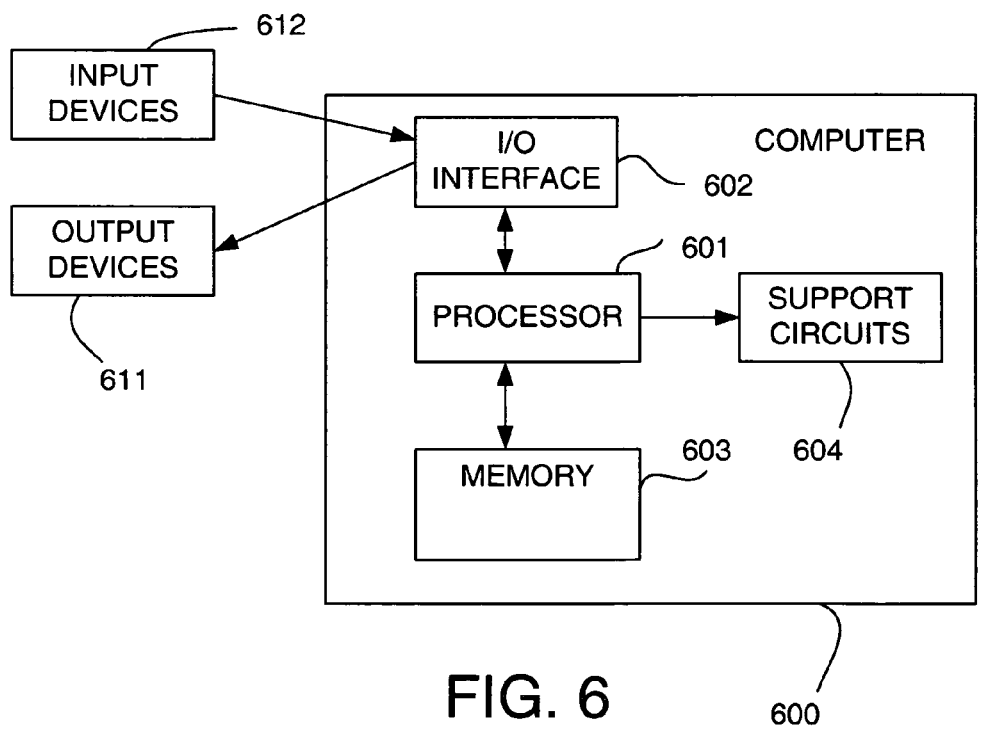
FIG. 6 is a block diagram depicting an exemplary embodiment of a computer suitable for implementing the processes and methods described herein.

FIG. 6 is a block diagram depicting an exemplary embodiment of a computer 600 suitable for implementing the processes and methods described herein. For example, the computer 600 may be used to implement the system 100 of FIG. 1, as well as the method 200 of FIG. 2. The computer 600 includes a processor 601, a memory 603, various support circuits 604, and an I/O interface 602. The processor 601 may be any type of microprocessor known in the art. The support circuits 604 for the processor 601 include conventional cache, power supplies, clock circuits, data registers, I/O interfaces, and the like. The I/O interface 602 may be directly coupled to the memory 603 or coupled through the processor 601. The I/O interface 602 may be coupled to various input devices 612 and output devices 611, such as a conventional keyboard, mouse, printer, display, and the like.

The memory 603 stores all or portions of one or more programs and/or data to implement the system 100 and the method 200 described herein. An exemplary embodiment of the present invention for implementing the method 200 is shown in the file CHKSCHEM1.TXT of the computer-program appendix. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 600 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 603. The memory 603 may include one or more of the following random access memory, read only memory, magneto-resistive read/write memory, optical read/write memory, cache memory, magnetic read/write memory, and the like, as well as computer readable media as described below.

An aspect of the invention is implemented as a program product for use with a computer system. Program(s) of the program product defines functions of embodiments and can be contained on a variety of computer readable media, which include, but are not limited to: (i) information permanently stored on non-writable storage media (e.g., read-only memory devices within a computer such as CD-ROM or DVD-ROM disks readable by a CD-ROM drive or a DVD drive); or (ii) alterable information stored on writable storage media (e.g., floppy disks within a diskette drive or hard-disk drive or read/writable CD or read/writable DVD)

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A method of performing electrical rule checks (ERCs) on a circuit design, comprising:
    creating a hierarchy of cells from a schematic database or netlist for the circuit design;
    traversing the hierarchy to identify master nets, the master nets being associated with shorted nets in the circuit design;
    traversing the hierarchy to identify ERC nets, the ERC nets being associated with effectively shorted nets in the circuit design, the effectively shorted nets including the shorted nets and nets each of which is connected to a source of a transistor or a drain of the transistor but not connected to each other; and
    performing, using a computer, at least one ERC on the circuit design by analyzing properties of the master nets and ERC nets, wherein the ERC nets do not include a ground net, wherein each of the master nets includes combined attributes of the respective shorted nets associated therewith, and wherein each of the ERC nets includes combined attributes of the respective effectively shorted nets associated therewith;
    wherein the performing comprises:
    executing at least one hierarchical ERC using the root nets;
    wherein each of the root nets is a particular one of the master nets or a particular one of the ERC nets having only pin connections and no port connections.

2. The method of claim 1, further comprising:
    outputting rule violations in response to the step of performing.

3. The method of claim 2, further comprising:
    obtaining waiver data; and
    removing at least one of the rule violations in response to the waiver data.

4. The method of claim 1, wherein each of the cells includes at least one port, wherein the cells include hierarchical cells and leaf cells, wherein each of the hierarchical cells includes at least one cell instance having at least one pin, and wherein each of the root nets comprises a net only having pin connections or a net in a top level cell of the hierarchy.

5. The method of claim 1, wherein the step of performing further comprises:
    executing at least one path-based ERC using the hierarchy of cells.

6. Apparatus for performing electrical rule checks (ERCs) on a circuit design, comprising:
    means for creating a hierarchy of cells from a schematic database or netlist for the circuit design;
    means for traversing the hierarchy to identify master nets, the master nets being associated with shorted nets in the circuit design;
    means for traversing the hierarchy to identify ERC nets, the ERC nets being associated with effectively shorted nets in the circuit design, the effectively shorted nets including the shorted nets and nets each of which is connected to a source of a transistor or a drain of the transistor but not connected to each other; and
    means for performing at least one ERC on the circuit design by analyzing properties of the master nets and the ERC nets, wherein the ERC nets do not include a ground net, wherein each of the master nets includes combined attributes of the respective shorted nets associated therewith, and wherein each of the ERC nets includes combined attributes of the respective effectively shorted nets associated therewith;
    wherein the performing comprises:
    executing at least one hierarchical ERC using the root nets;
    wherein each of the root nets is a particular one of the master nets or a particular one of the ERC nets having only pin connections and no port connections.

7. The apparatus of claim 6, further comprising:
    means for outputting rule violations in response to the step of performing.

8. The apparatus of claim 7, further comprising:
    means for obtaining waiver data; and
    means for removing at least one of the rule violations in response to the waiver data.

9. The apparatus of claim 6, wherein each of the cells includes at least one port, wherein the cells include hierarchical cells and leaf cells, wherein each of the hierarchical cells includes at least one cell instance having at least one pin, and wherein each of the root nets comprises a net only having pin connections or a net in a top level cell of the hierarchy.

10. The apparatus of claim 6, wherein the means for performing further comprises:
    means for executing at least one path-based ERC using the hierarchy of cells.

11. A non-transitory computer readable medium having stored thereon software that when executed by a processor causes the processor to perform a method of electrical rule checks (ERCs) on a circuit design, comprising:
    creating a hierarchy of cells from a schematic database or netlist for the circuit design;
    traversing the hierarchy to identify master nets, the master nets being associated with shorted nets in the circuit design;
    traversing the hierarchy to identify ERC nets, the ERC nets being associated with effectively shorted nets in the circuit design, the effectively shorted nets including the shorted nets and nets each of which is connected to a source of a transistor or a drain of the transistor but not connected to each other; and
    performing at least one ERC on the circuit design by analyzing properties of the master nets and the ERC nets, wherein the ERC nets do not include a ground net, wherein each of the master nets includes combined attributes of the respective shorted nets associated therewith, and wherein each of the ERC nets includes combined attributes of the respective effectively shorted nets associated therewith;
    wherein the performing comprises:
    executing at least one hierarchical ERC using the root nets;
    wherein each of the root nets is a particular one of the master nets or a particular one of the ERC nets having only pin connections and no port connections.

12. The computer readable medium of claim 11, further comprising:
   outputting rule violations in response to the step of performing;
   obtaining waiver data; and
   removing at least one of the rule violations in response to the waiver data.

13. The computer readable medium of claim 11, wherein each of the cells includes at least one port, wherein the cells includes hierarchical cells and leaf cells, wherein each of the hierarchical cells include at least one cell instance having at least one pin, and wherein each of the root nets comprises a net only having pin connections or a net in a top level cell of the hierarchy.

14. The computer readable medium of claim 11, wherein the step of performing further comprises:
   executing at least one path-based ERC using the hierarchy of cells.

* * * * *